(12) United States Patent
Sievert et al.

(10) Patent No.: US 9,806,759 B1
(45) Date of Patent: Oct. 31, 2017

(54) LOW DROP OUT COMPENSATION TECHNIQUE FOR REDUCED DYNAMIC ERRORS IN DIGITAL-TO-TIME CONVERTERS

(71) Applicant: Intel IP Corporation, Santa Clara, CA (US)

(72) Inventors: Sebastian Sievert, Munich (DE); Ofir Degani, Haifa (IL); Eshel Gordon, Aloney Aba (IL)

(73) Assignee: Intel IP Corporation, Santa Clara, CA (US)

(*) Notice: Subject to any disclaimer, the term of this patent is extended or adjusted under 35 U.S.C. 154(b) by 0 days.

(21) Appl. No.: 15/200,495

(22) Filed: Jul. 1, 2016

(51) Int. Cl.
*H04B 1/04* (2006.01)
*H04B 1/40* (2015.01)
*G05F 3/26* (2006.01)
*G05F 3/20* (2006.01)
*H04B 1/62* (2006.01)

(52) U.S. Cl.
CPC .............. *H04B 1/40* (2013.01); *G05F 3/205* (2013.01); *G05F 3/26* (2013.01)

(58) Field of Classification Search
CPC ... H04L 27/20; H04L 27/201; H04L 27/2032; H04L 27/2042; H04L 27/2046; H04L 27/361; H03C 3/40

USPC ....................................................... 445/110
See application file for complete search history.

(56) References Cited

U.S. PATENT DOCUMENTS

| | | | |
|---|---|---|---|
| 2007/0216383 A1* | 9/2007 | Al-Shyoukh | G05F 1/468 323/280 |
| 2011/0156783 A1* | 6/2011 | Pavlovic | H03L 7/081 327/159 |
| 2015/0036767 A1 | 2/2015 | Degani et al. | |
| 2015/0049840 A1 | 2/2015 | Banin et al. | |

\* cited by examiner

*Primary Examiner* — Lee Nguyen
(74) *Attorney, Agent, or Firm* — Schwegman Lundberg & Woessner, P.A.

(57) ABSTRACT

An apparatus comprises a radio frequency (RF) transceiver circuit; a phase modulator that comprises digital-to-time converter (DTC) circuitry configured to convert a digital value to a specified signal phase of a signal transmitted by the RF transceiver circuit; low drop out regulator (LDO) circuitry operatively coupled to the DTC circuitry, wherein a bias current of the LDO circuitry is adjustable; and logic circuitry operatively coupled to the LDO circuitry and DTC circuitry, wherein the logic circuitry is configured to set the adjustable bias current of the LDO circuitry according to a digital value input to the DTC circuitry.

24 Claims, 7 Drawing Sheets

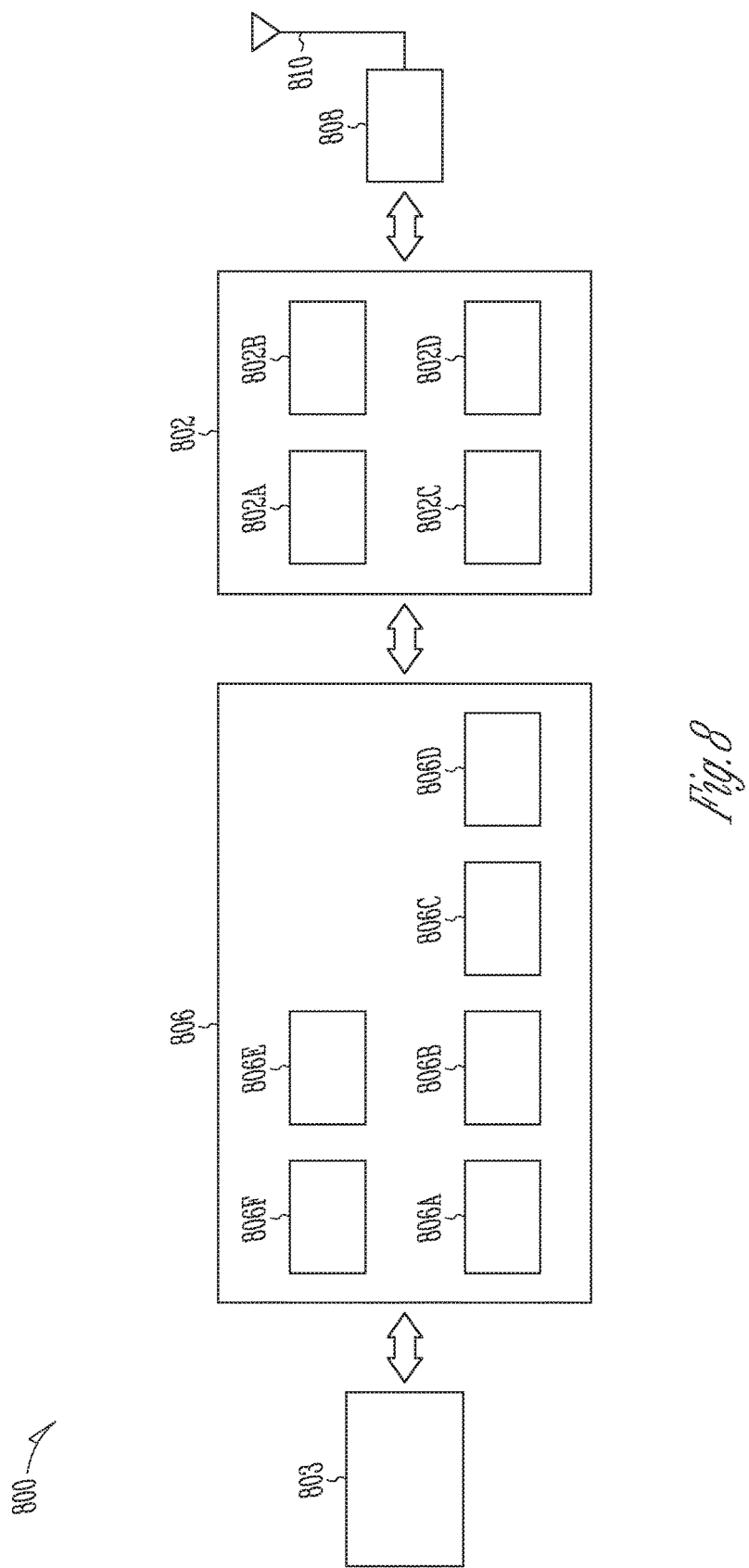

US 9,806,759 B1

LOW DROP OUT COMPENSATION TECHNIQUE FOR REDUCED DYNAMIC ERRORS IN DIGITAL-TO-TIME CONVERTERS

TECHNICAL FIELD

Embodiments pertain to radio frequency circuits for wireless communications. Some embodiments relate to phase modulator circuits in transceiver architectures. Some embodiments relate to reducing sensitivity of circuits that use power supply regulation to fast load current transients triggered by changes in digital inputs to the circuits.

BACKGROUND

Radio frequency (RF) devices are used for voice and data communication. Some RF devices are mobile devices (e.g., cellular phones) that are battery powered. Because RF devices do not typically have equal current consumption all of the time, RF devices generally have regulated power supplies. However, some circuits of RF devices can have poor power supply rejection. Thus, there are general needs for devices, systems and methods for RF circuits that provide robust performance by either reducing power supply disturbances or not being negatively impacted by power supply disturbances.

BRIEF DESCRIPTION OF THE DRAWINGS

FIG. 8 illustrates example components of a UE device in accordance with some embodiments.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

RF devices that communicate using a radio access network can include digital polar transmitter (DPTX) circuit architectures. A DPTX circuit uses polar coordinates (e.g., amplitude and phase) rather than Cartesian coordinates (e.g., I and Q coordinates) for RF signal modulation. A DPTX approach offers advantages in size and power consumption over analog radio transmitter architectures. A DPTX circuit may include a digital-to-time converter (DTC) to provide phase modulation to transmitted signals. The DTC modulates a local oscillator (LO) signal with phase information using only digital circuits. This can reduce the number of inductors needed for the RF transmitter which leads to reduced size.

Figures 1, 2:
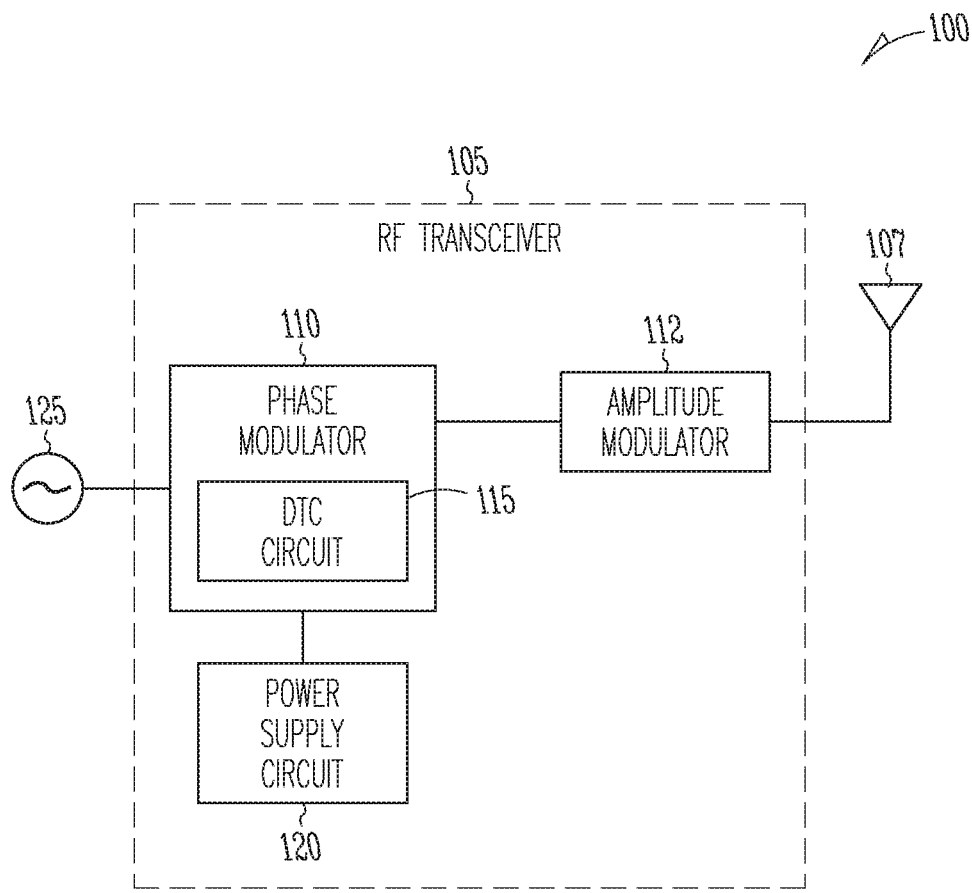
FIG. 1 is a block diagram of portions of a radio frequency communication device in accordance with some embodiments.
FIG. 2 is a timing diagram of a local oscillator signal at the output of a digital-to-time converter (DTC) circuit in accordance with some embodiments.

FIG. 1 is a block diagram of portions of an embodiment of an RF device 100 for communication using a radio access network. In certain embodiments, the RF device can be user equipment (UE) for a cellular communication network. The device includes an RF transceiver circuit 105. The RF transceiver circuit can include a phase modulator 110 and amplitude modulator 112. One or more antennas 107 may be electrically coupled to the RF transceiver circuit 105. The phase modulator 110 includes a DTC circuit 115 operatively coupled to a power supply circuit 120. The DTC circuit 115 receives a digital value at an input and converts the digital value to a specified signal phase of a signal transmitted by the RF transceiver circuit. The power supply circuit 120 provides a regulated supply voltage to the phase modulator 110 and DTC circuit 115. In some embodiments, the RF device includes a local oscillator (LO) circuit 125 that provides a LO signal to the DTC circuit 115, and the DTC circuit 115 converts the digital value to a specified delay of the LO signal.

FIG. 2 is a timing diagram of the LO signal at the output of the DTC circuit. The DTC code is the digital value input to the DTC circuit and the waveforms show the resulting DTC output signal. Three DTC code examples are shown in FIG. 2. For the top waveform, the DTC code is 0 for a delay of 0 corresponding to a phase of 0°. The middle waveform shows the example for a DTC code for a delay of 12.5% corresponding to a phase of 45° or π/4. The bottom waveform shows the example for a DTC code for a delay of 25% corresponding to a phase of 90° or π/2. An RF signal to be transmitted may be modulated onto the phase modulated LO signal. In certain embodiments, the amplitude modulator 112 includes a digital power amplifier (DPA) to modulate the amplitude of the signal to be transmitted onto the phase modulated LO signal.

Figure 3:
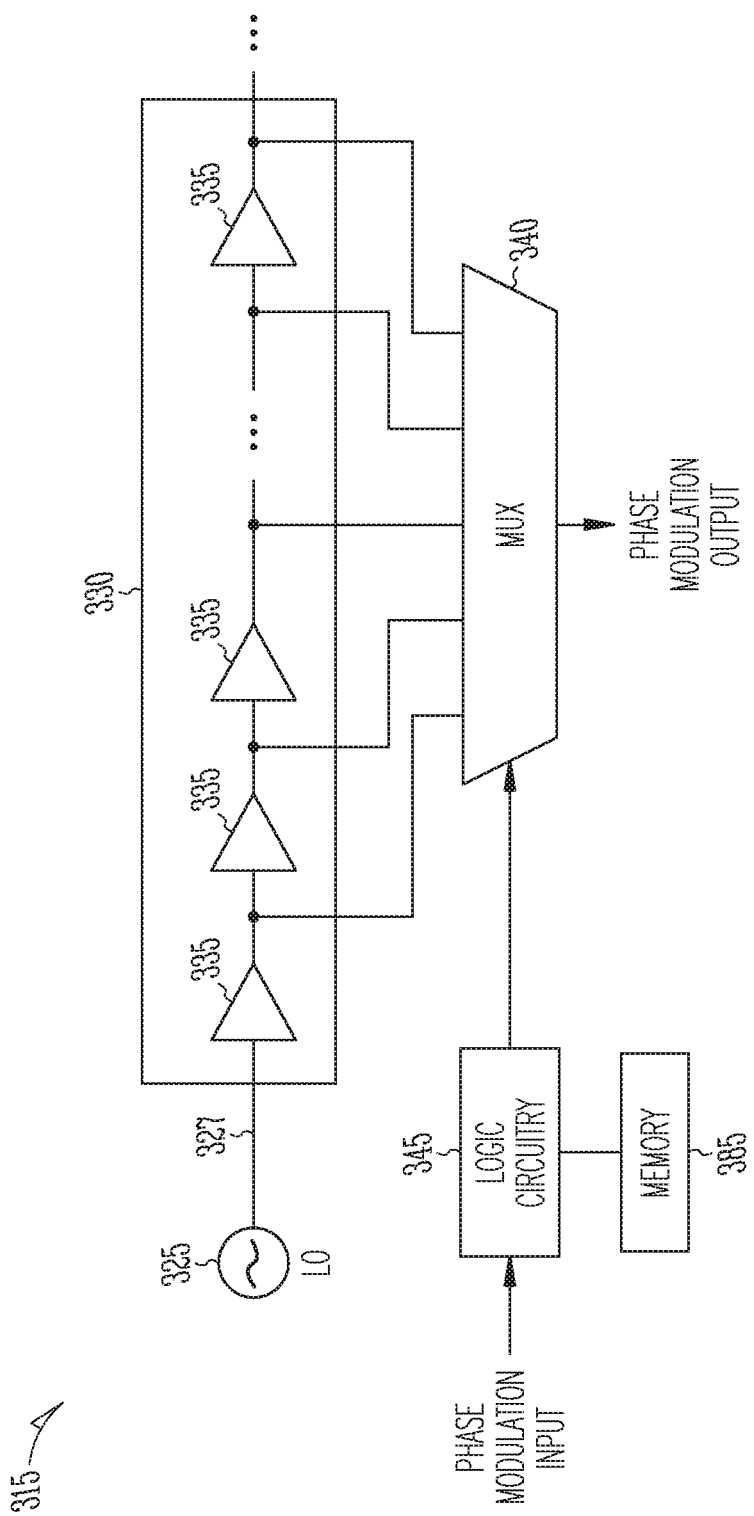
FIG. 3 is a circuit block diagram of portions of an embodiment of a DTC circuit in accordance with some embodiments.

FIG. 3 is a circuit block diagram of portions of an embodiment of a DTC circuit 315. The DTC circuit includes a delay line 330 electrically coupled to a LO circuit 325. The delay line 330 may include multiple unit circuit delays 335 electrically coupled in series. The DTC circuit 315 applies the LO signal 327 to a specified number of the unit circuit delays to generate the phase modulated signal. The embodiment shown in FIG. 3 includes a multiplexer circuit 340 and logic circuitry 345. The number of delays applied to the LO signal can be selected using the multiplexer circuit 340 (or Mux) and logic circuitry 345. For example, the logic circuitry 345 may output a digital value to the multiplexer circuit 340. The digital value determines which tap of the delay line provides the phase modulated signal at the output.

Figure 4:
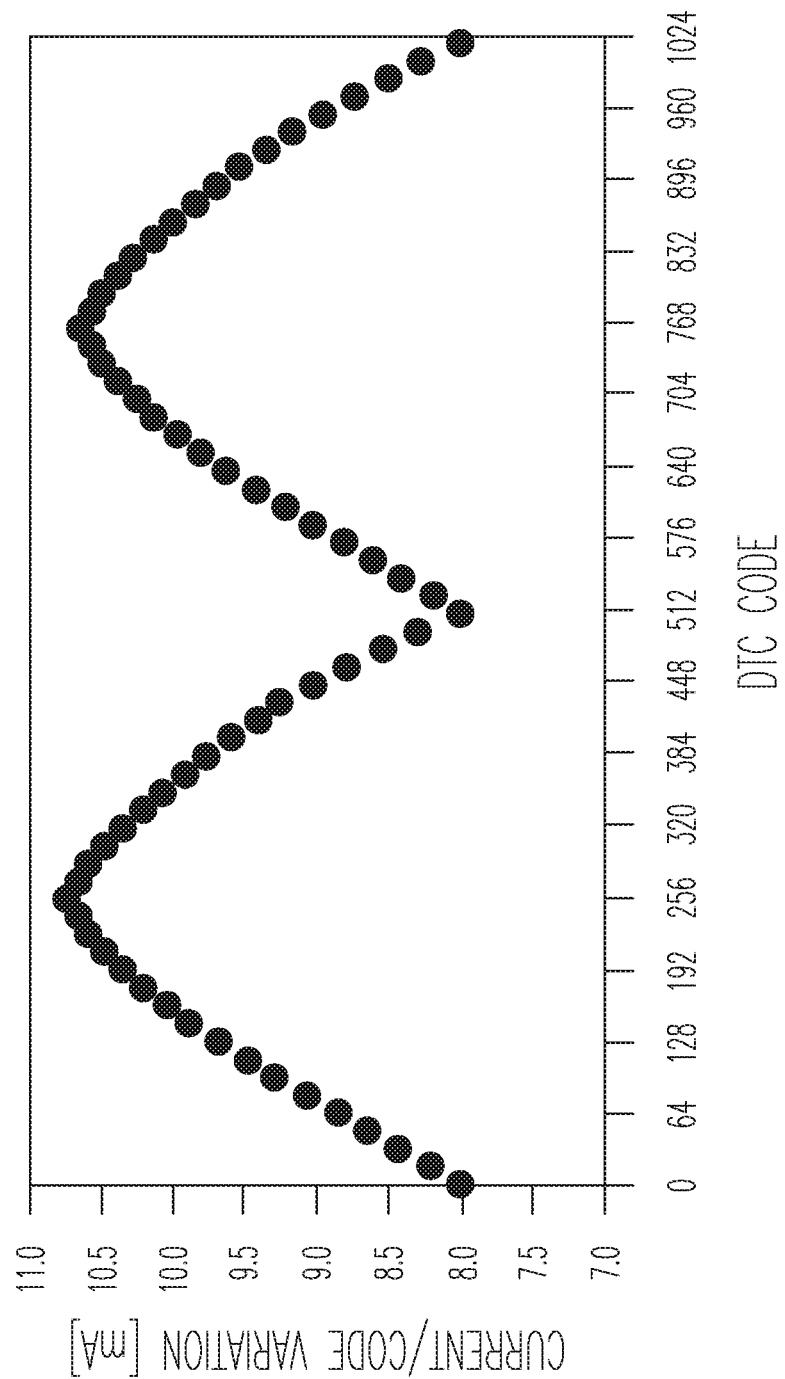
FIG. 4 is a graph of an example of current variation versus DTC code for a DTC circuit in accordance with some embodiments.

A DTC circuit 315 may have poor power supply rejection. Changes in the supply voltage provided to the DTC circuit can be manifested on the phase signal at the output of the DTC circuit. This can lead to errors in the phase modulation. One source of the errors is the variable current consumption of the DTC circuit. Different phase delays programmed in the DTC circuit by changing the digital value input to the DTC circuit may involve different levels of current consumption. FIG. 4 is a graph of an example of current variation versus DTC code for a DTC circuit. The graph shows the variation in current due to different values of a ten bit DTC code input to the DTC circuit. If the DTC circuit transitions from a digital value with low current demand to a different digital value with a higher current demand, the change in demand on the power supply may induce errors in the phase delay modulation.

Figure 5A:
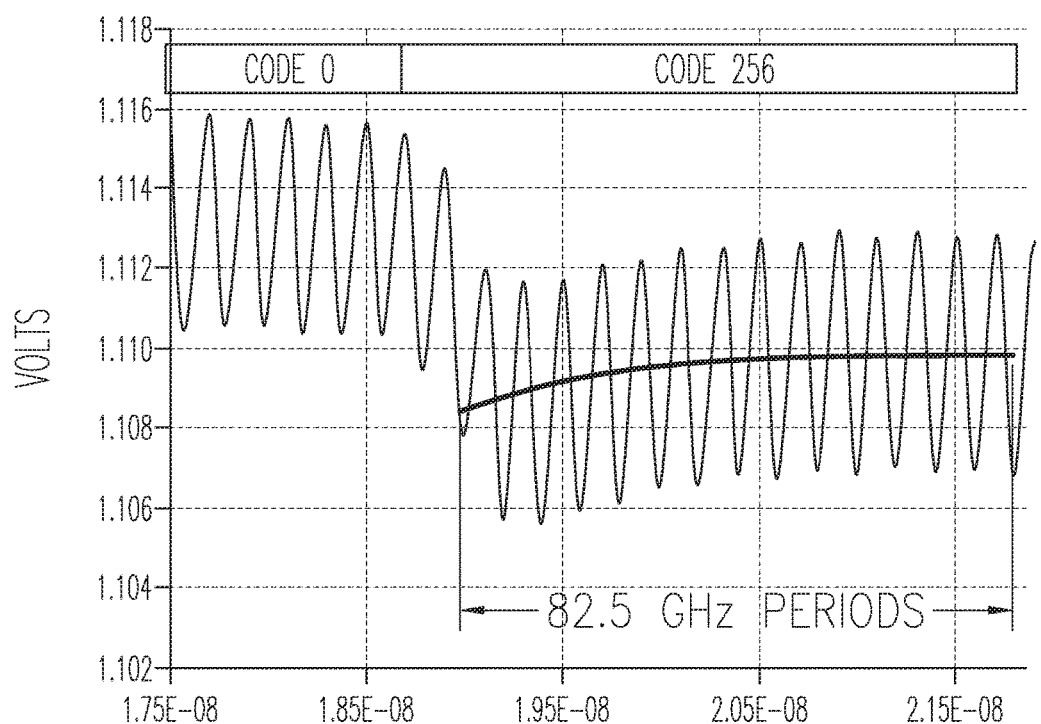
FIG. 5A is a graph of an example of a change in supply voltage for a DTC circuit resulting from a step change in current demand.
Figure 5B:
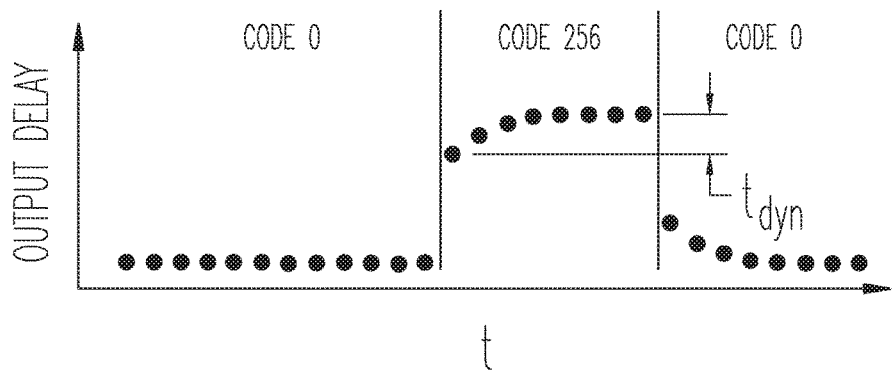
FIG. 5B is a graph showing the effect on the phase delay versus time resulting from the change in demand on the power supply in FIG. 5A.

FIG. 5A is a graph of an example of a change in supply voltage for a DTC circuit resulting from a step change in current demand. The graph shows the power supply output voltage versus clock period when the digital value changes from a code of 0 to a code of 256. FIG. 5B is a graph showing the effect on the phase delay versus time resulting from the change in demand on the power supply in the example of FIG. 5A. FIG. 5B shows that it takes multiple clock cycles to settle to the programmed delay value. This settling time may cause errors in the phase modulation. The settling time may be a function of the response by power supply regulating circuit. A regulating circuit with a faster response time and hence higher bandwidth would help improve the settling time, but the faster response time may come with a cost of higher current consumption and larger circuit area.

Figure 6:
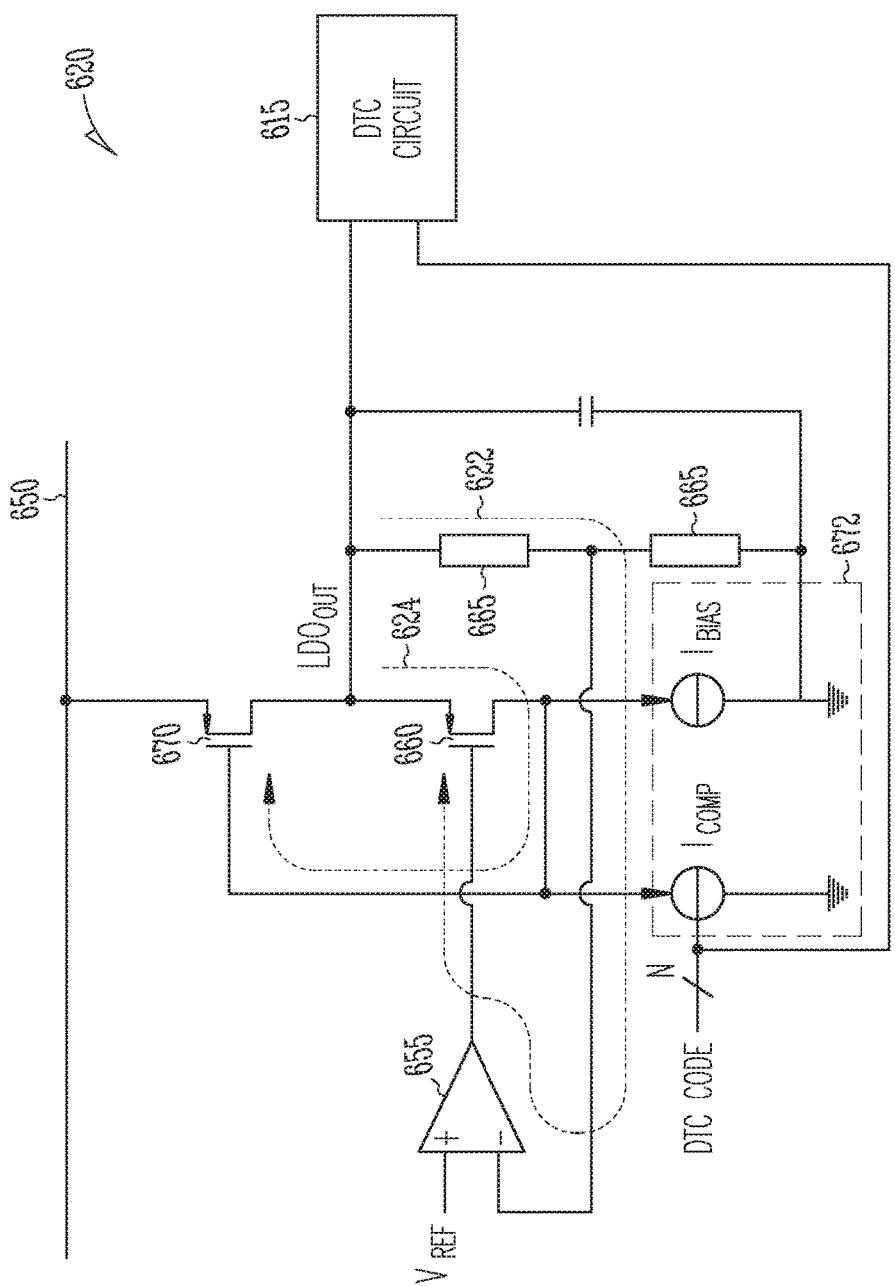
FIG. 6 is an embodiment of a low drop out regulator circuit in accordance with some embodiments.

FIG. 6 is an embodiment of a low drop out regulator (LDO) circuit 620. The LDO circuit 620 is electrically coupled to a positive supply rail 650 and circuit ground. The LDO circuit 620 provides a direct current (DC) regulated output voltage level to DTC circuit 615 that can be very close in value to the positive voltage supply rail. The LDO circuit 620 includes an error amplifier circuit 655 and a cascade transistor 660 coupled to a pass gate transistor 670. In FIG. 6, the cascade transistor 660 and the pass gate transistor 670 are metal oxide semiconductor (MOS) transistors. In the embodiment in FIG. 6, the MOS transistors are a p-type metal oxide semiconductor (PMOS) transistors. The error amplifier circuit 655 senses the voltage at the output and activates the cascade transistor 660 according to a difference between a voltage at the LDO output and a reference voltage Vref. In the embodiment shown in FIG. 6, the output voltage is divided down using resistors 665. The LDO circuit 620 includes a voltage supply rail and the pass gate transistor 670 electrically coupled to the voltage supply rail 650, and current supplied to the DTC circuit 615 flows through the pass gate transistor 670. The regulated output of the LDO circuit 620 differs from the supply voltage only by the source-drain voltage of transistor 670.

The LDO circuit 620 includes a slow control loop 622 that includes the cascade transistor 660, a resistor 665, and the error amplifier circuit 655. The LDO circuit 620 also includes fast control loop 624 that includes the cascade transistor 660 and the circuit path from the drain of the cascade transistor 660 to the gate of transistor 670. The slow control loop has high gain and low bandwidth and controls the absolute output voltage. The fast control loop has low gain and high bandwidth and regulates errors in the output voltage due to changes in the load current. The amount of settling time of FIG. 5B is mainly dependent on the amount of bandwidth of the fast control loop.

The LDO circuit 620 includes an adjustable bias current. In some embodiments, the LDO circuit 620 includes multiple current source circuits. The bias current may be programmable by activating and deactivating current sources. In the embodiment of FIG. 6, the LDO circuit includes multiple current mirrors 672 connected in parallel at the drain of the cascade transistor 660. The bias current can be adjusted by enabling or disabling current mirrors to set the amount of bias current. As explained previously, when a change in the digital input triggers a fast transient in load current, the regulation of the LDO circuit would bring the fast and slow control loops to steady-state operation after a settling time. Changing the bias current brings the fast and slow control loops close to their steady-state operation more quickly. If the current consumption or current demand for a specified digital value input to the DTC circuit is known, the bias current can be adjusted with the change in digital value. In some of these embodiments, the current necessary for proper performance of the LDO circuit is provided, and the higher current is supplied only when determined by the programmed phase. In some embodiments, the current necessary for proper performance of the LDO circuit is provided, and the higher current is supplied only when required by the programmed phase, although the scope of the embodiments is not limited in this respect.

In some embodiments, logic circuitry is electrically coupled to the LDO circuit and DTC circuit (e.g., logic circuitry 345 of the device in FIG. 3). In certain embodiments, the logic circuitry includes a processor circuit (e.g., a microprocessor). In certain embodiments, the logic circuitry includes a state machine circuit. The state machine circuit sequentially steps through a fixed series of steps or states to perform one or more of the functions described. The logic for the sequence is typically implemented in hardware or firmware.

The logic circuitry sets the adjustable bias current of the LDO circuit according to the specified digital value input to the DTC circuit. In some embodiments, the logic circuitry 345 translates the digital value input to the DTC to a coded current value, and activates or deactivates the current source circuits according to the coded current value to compensate the bias point of the LDO circuit for the change in digital value. In certain embodiments, the logic circuitry generates both the digital value for the DTC circuit to generate the phase delay and the coded current value to program the adjustable bias current. In certain embodiments, the logic circuitry receives the digital value input to the DTC circuit from separate circuitry and determines the coded current value from the received digital value.

In some embodiments, a memory circuit 385 is electrically coupled to or integral to the logic circuitry. The memory circuit 385 stores a look up table containing coded current values indexed by the digital value for the delay input to the DTC circuit. The indexing translates the delay value to a coded current value. The logic circuitry programs the bias current circuit by enabling and disabling current source circuits according to the coded current value.

Although the compensation for the regulator circuit has been described using a specific embodiment of an LDO circuit, one skilled in the art would understand upon reading this detailed description that other LDO circuit topologies can be compensated using the approaches described herein. Additionally, the LDO circuit compensation can be used for other applications of the LDO circuit.

Figure 7:
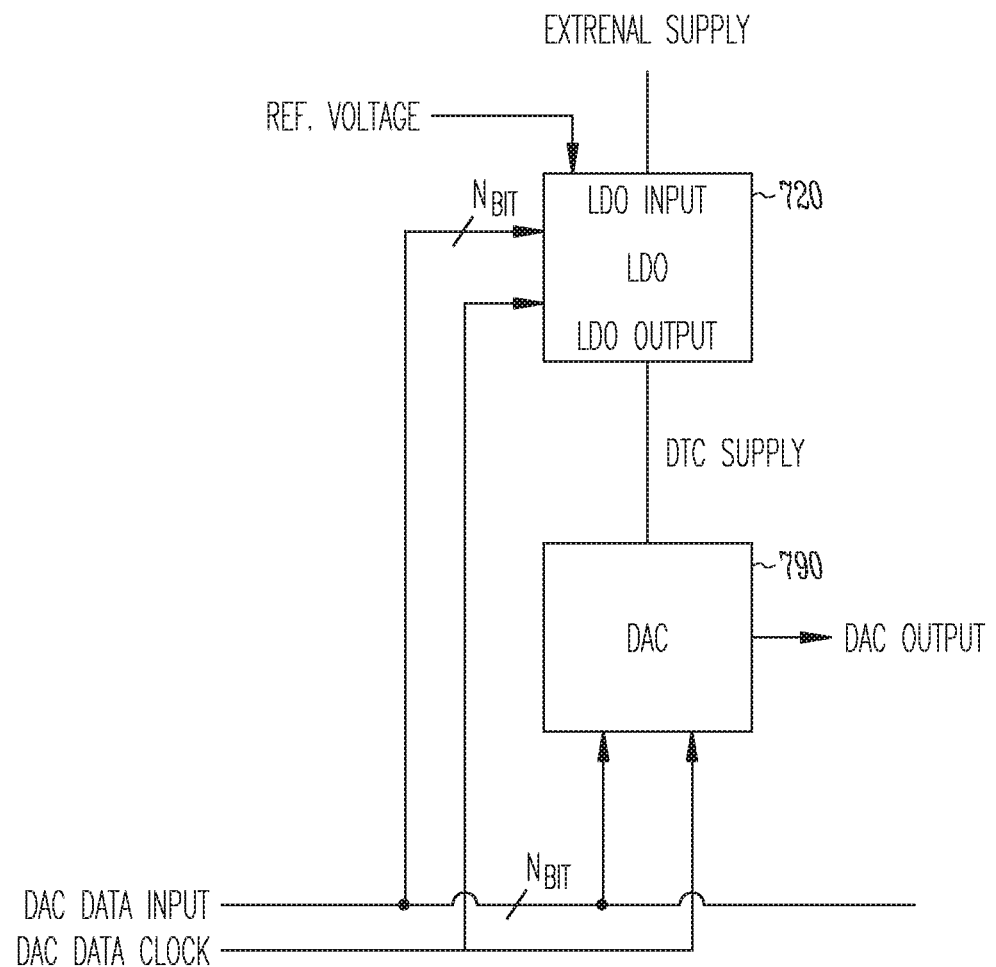
FIG. 7 is a block diagram of an electronic circuit that includes a digital-to-analog converter circuit and a low dropout regulator circuit in accordance with some embodiments.

FIG. 7 is a block diagram of an electronic circuit that includes a digital-to-analog converter (DAC) circuit 790 and an LDO circuit 720. The DAC circuit 790 converts a digital value at the input to the DAC circuit to an analog signal at an output of the DAC. Different digital values input to the DAC may result in different loads on the LDO circuit. If the LDO circuit has adjustable bias current and the current demand for a specified digital value input to the DTC circuit is known, the bias current can be adjusted with the change in digital value (e.g., by logic circuitry). As with the DTC circuit, a lookup table stored in memory can be indexed by the digital input value to determine a coded current value used to enable and disable current mirrors to program the bias current of the LDO circuit.

Embodiments described herein may be implemented into a system using any suitably configured hardware and/or software. FIG. 8 illustrates, for one embodiment, example components of a User Equipment (UE) device 800. In some embodiments, the UE device 800 may include application circuitry 803, baseband circuitry 806, Radio Frequency (RF) circuitry 802, front-end module (FEM) circuitry 808 and one or more antennas 801, coupled together at least as shown.

The application circuitry 803 may include one or more application processors. For example, the application circuitry 803 may include circuitry such as, but not limited to, one or more single-core or multi-core processors. The processor(s) may include any combination of general-purpose processors and dedicated processors (e.g., graphics processors, application processors, etc.). The processors may be coupled with and/or may include memory/storage and may be configured to execute instructions stored in the memory/storage to enable various applications and/or operating systems to run on the system.

The baseband circuitry 806 may include circuitry such as, but not limited to, one or more single-core or multi-core processors. The baseband circuitry 806 may include one or more baseband processors and/or control logic to process baseband signals received from a receive signal path of the RF circuitry 802 and to generate baseband signals for a transmit signal path of the RF circuitry 802. Baseband processing circuitry 806 may interface with the application circuitry 803 for generation and processing of the baseband signals and for controlling operations of the RF circuitry 802. For example, in some embodiments, the baseband circuitry 806 may include a second generation (2G) baseband processor 806a, third generation (3G) baseband processor 806b, fourth generation (4G) baseband processor 806c, and/or other baseband processor(s) 806d for other existing generations, generations in development or to be developed in the future (e.g., fifth generation (5G), 6G, etc.). The baseband circuitry 806 (e.g., one or more of baseband processors 806a-d) may handle various radio control functions that enable communication with one or more radio networks via the RF circuitry 802. The radio control functions may include, but are not limited to, signal modulation/demodulation, encoding/decoding, radio frequency shifting, etc. In some embodiments, modulation/demodulation circuitry of the baseband circuitry 806 may include Fast-Fourier Transform (FFT), precoding, and/or constellation mapping/demapping functionality. In some embodiments, encoding/decoding circuitry of the baseband circuitry 806 may include convolution, tail-biting convolution, turbo, Viterbi, and/or Low Density Parity Check (LDPC) encoder/decoder functionality. Embodiments of modulation/demodulation and encoder/decoder functionality are not limited to these examples and may include other suitable functionality in other embodiments.

In some embodiments, the baseband circuitry 806 may include elements of a protocol stack such as, for example, elements of an evolved universal terrestrial radio access network (E-UTRAN) protocol including, for example, physical (PHY), media access control (MAC), radio link control (RLC), packet data convergence protocol (PDCP), and/or radio resource control (RRC) elements. A central processing unit (CPU) 806e of the baseband circuitry 806 may be configured to run elements of the protocol stack for signaling of the PHY, MAC, RLC, PDCP, and/or RRC layers. In some embodiments, the baseband circuitry may include one or more audio digital signal processor(s) (DSP) 806f. The audio DSP(s) 806f may be include elements for compression/decompression and echo cancellation and may include other suitable processing elements in other embodiments. Components of the baseband circuitry may be suitably combined in a single chip, a single chipset, or disposed on a same circuit board in some embodiments. In some embodiments, some or all of the constituent components of the baseband circuitry 806 and the application circuitry 803 may be implemented together such as, for example, on a system on a chip (SOC).

In some embodiments, the baseband circuitry 806 may provide for communication compatible with one or more radio technologies. For example, in some embodiments, the baseband circuitry 806 may support communication with an evolved universal terrestrial radio access network (EUTRAN) and/or other wireless metropolitan area networks (WMAN), a wireless local area network (WLAN), a wireless personal area network (WPAN). Embodiments in which the baseband circuitry 806 is configured to support radio communications of more than one wireless protocol may be referred to as multi-mode baseband circuitry.

RF circuitry 802 may enable communication with wireless networks using modulated electromagnetic radiation through a non-solid medium. In various embodiments, the RF circuitry 802 may include switches, filters, amplifiers, etc. to facilitate the communication with the wireless network. RF circuitry 802 may include a receive signal path which may include circuitry to down-convert RF signals received from the FEM circuitry 808 and provide baseband signals to the baseband circuitry 806. RF circuitry 802 may also include a transmit signal path which may include circuitry to up-convert baseband signals provided by the baseband circuitry 806 and provide RF output signals to the FEM circuitry 808 for transmission.

In some embodiments, the RF circuitry 802 may include a receive signal path and a transmit signal path. The receive signal path of the RF circuitry 802 may include mixer circuitry 802a, amplifier circuitry 802b and filter circuitry 802c. The transmit signal path of the RF circuitry 802 may include filter circuitry 802c and mixer circuitry 802a. RF circuitry 802 may also include synthesizer circuitry 802d for synthesizing a frequency for use by the mixer circuitry 802a of the receive signal path and the transmit signal path. In some embodiments, the mixer circuitry 802a of the receive signal path may be configured to down-convert RF signals received from the FEM circuitry 808 based on the synthesized frequency provided by synthesizer circuitry 802d. The amplifier circuitry 802b may be configured to amplify the down-converted signals and the filter circuitry 802c may be a low-pass filter (LPF) or band-pass filter (BPF) configured to remove unwanted signals from the down-converted signals to generate output baseband signals. Output baseband signals may be provided to the baseband circuitry 804 for further processing. In some embodiments, the output baseband signals may be zero-frequency baseband signals, although this is not a requirement. In some embodiments, mixer circuitry 802a of the receive signal path may comprise passive mixers, although the scope of the embodiments is not limited in this respect.

In some embodiments, the mixer circuitry 802a of the transmit signal path may be configured to up-convert input baseband signals based on the synthesized frequency provided by the synthesizer circuitry 802d to generate RF output signals for the FEM circuitry 808. The baseband signals may be provided by the baseband circuitry 806 and may be filtered by filter circuitry 802c. The filter circuitry 802c may include a low-pass filter (LPF), although the scope of the embodiments is not limited in this respect.

In some embodiments, the mixer circuitry 802a of the receive signal path and the mixer circuitry 802a of the transmit signal path may include two or more mixers and may be arranged for quadrature downconversion and/or upconversion respectively. In some embodiments, the mixer circuitry 802a of the receive signal path and the mixer circuitry 802a of the transmit signal path may include two or more mixers and may be arranged for image rejection (e.g., Hartley image rejection). In some embodiments, the mixer circuitry 802a of the receive signal path and the mixer circuitry 802a may be arranged for direct downconversion and/or direct upconversion, respectively. In some embodiments, the mixer circuitry 802a of the receive signal path and the mixer circuitry 802a of the transmit signal path may be configured for super-heterodyne operation.

In some embodiments, the output baseband signals and the input baseband signals may be analog baseband signals, although the scope of the embodiments is not limited in this respect. In some alternate embodiments, the output baseband signals and the input baseband signals may be digital baseband signals. In these alternate embodiments, the RF circuitry 802 may include analog-to-digital converter (ADC) and digital-to-analog converter (DAC) circuitry and the baseband circuitry 806 may include a digital baseband interface to communicate with the RF circuitry 802.

In some dual-mode embodiments, a separate radio IC circuitry may be provided for processing signals for each spectrum, although the scope of the embodiments is not limited in this respect.

In some embodiments, the synthesizer circuitry 802d may be a fractional-N synthesizer or a fractional N/N+1 synthesizer, although the scope of the embodiments is not limited in this respect as other types of frequency synthesizers may be suitable. For example, synthesizer circuitry 802d may be a delta-sigma synthesizer, a frequency multiplier, or a synthesizer comprising a phase-locked loop with a frequency divider.

The synthesizer circuitry 802d may be configured to synthesize an output frequency for use by the mixer circuitry 802a of the RF circuitry 802 based on a frequency input and a divider control input. In some embodiments, the synthesizer circuitry 802d may be a fractional N/N+1 synthesizer.

In some embodiments, frequency input may be provided by a voltage controlled oscillator (VCO), although that is not a requirement. Divider control input may be provided by either the baseband circuitry 806 or the applications processor 803 depending on the desired output frequency. In some embodiments, a divider control input (e.g., N) may be determined from a look-up table based on a channel indicated by the applications processor 803.

Synthesizer circuitry 802d of the RF circuitry 802 may include a divider, a delay-locked loop (DLL), a multiplexer and a phase accumulator. In some embodiments, the divider may be a dual modulus divider (DMD) and the phase accumulator may be a digital phase accumulator (DPA). In some embodiments, the DMD may be configured to divide the input signal by either N or N+1 (e.g., based on a carry out) to provide a fractional division ratio. In some example embodiments, the DLL may include a set of cascaded, tunable, delay elements, a phase detector, a charge pump and a D-type flip-flop. In these embodiments, the delay elements may be configured to break a VCO period up into Nd equal packets of phase, where Nd is the number of delay elements in the delay line. In this way, the DLL provides negative feedback to help ensure that the total delay through the delay line is one VCO cycle.

In some embodiments, synthesizer circuitry 802d may be configured to generate a carrier frequency as the output frequency, while in other embodiments, the output frequency may be a multiple of the carrier frequency (e.g., twice the carrier frequency, four times the carrier frequency) and used in conjunction with quadrature generator and divider circuitry to generate multiple signals at the carrier frequency with multiple different phases with respect to each other. In some embodiments, the output frequency may be a LO frequency ($f_{LO}$). In some embodiments, the RF circuitry 802 may include an IQ/polar converter.

FEM circuitry 808 may include a receive signal path which may include circuitry configured to operate on RF signals received from one or more antennas 810, amplify the received signals and provide the amplified versions of the received signals to the RF circuitry 802 for further processing. FEM circuitry 808 may also include a transmit signal path which may include circuitry configured to amplify signals for transmission provided by the RF circuitry 802 for transmission by one or more of the one or more antennas 810.

In some embodiments, the FEM circuitry 808 may include a TX/RX switch to switch between transmit mode and receive mode operation. The FEM circuitry may include a receive signal path and a transmit signal path. The receive signal path of the FEM circuitry may include a low-noise amplifier (LNA) to amplify received RF signals and provide the amplified received RF signals as an output (e.g., to the RF circuitry 802). The transmit signal path of the FEM circuitry 808 may include a power amplifier (PA) to amplify input RF signals (e.g., provided by RF circuitry 802), and one or more filters to generate RF signals for subsequent transmission (e.g., by one or more of the one or more antennas 810.

In some embodiments, the UE device 800 may include additional elements such as, for example, memory/storage, display, camera, sensor, and/or input/output (I/O) interface.

The several embodiments described herein provide for power supply regulation of phase modulation in a feed forward fashion. Many of the embodiments have been described in terms of a DTC circuit, but the methods and devices can be applied to any circuit that may experience fast load current transients caused by changes in digital inputs to the circuit, such as a circuit that generates digital clock signals for example. Knowledge of the current consumption of the power supply regulator allows for modification of the control of the power supply regulator to provide a constant voltage at the output and improve power supply rejection of the phase modulation.

Additional Description and Examples

Example 1 includes subject matter (such as an apparatus) comprising: radio frequency (RF) transceiver circuitry configured to transmit and receive data with a network and a mobile communication device; a phase modulator that comprises digital-to-time converter (DTC) circuitry configured to convert a digital value to a specified signal phase of a signal transmitted by the RF transceiver circuitry; low drop out regulator (LDO) circuitry operatively coupled to the DTC circuitry, wherein a bias current of the LDO is adjustable; and logic circuitry electrically coupled to the LDO circuitry and DTC circuitry, wherein the logic circuitry is configured to set the adjustable bias current of the LDO circuitry according to a digital value input to the DTC circuitry.

In Example 2, the subject matter of Example 1 optionally includes a memory circuit configured to store a look up table containing coded current values indexed by the digital value input to the DTC circuitry, wherein the LDO circuitry includes a programmable bias current circuit to produce the adjustable bias current, and wherein the logic circuitry is configured to set the bias current of the programmable bias current circuit using a coded current value corresponding to the digital value input to the DTC circuitry.

In Example 3, the subject matter of Example 2 optionally includes a programmable bias current circuit including multiple current source circuits connected in parallel, and wherein the logic circuitry is configured to perform one or both of activating and deactivating the current source circuits according to the coded current value.

In Example 4, the subject matter of one or any combination of Examples 1-3 optionally includes a local oscillator (LO) circuit that provides a LO signal to the DTC circuitry, wherein the DTC circuitry converts the digital value to a specified delay of the LO signal.

In Example 5, the subject matter of Example 4 optionally includes a delay line electrically coupled to the LO circuit, wherein the delay line includes multiple unit circuit delays electrically coupled in series, and wherein the DTC circuitry is configured to apply the LO signal to a specified number of the unit circuit delays according to the digital value.

In Example 6, the subject matter of one or any combinations of Examples 1-5 optionally includes a phase modulator and a DTC circuitry included in digital polar transmitter (DPTX) circuitry configured to apply amplitude and phase modulation to the signal transmitted by the RF transceiver circuitry.

In Example 7, the subject matter of one or any combination of Examples 1-6 optionally includes LDO circuitry including an error amplifier circuit and a pass gate circuit that includes a first metal oxide semiconductor (MOS) transistor, wherein the error amplifier circuit is configured to activate the pass gate circuit according to a difference between a voltage at the LDO output and a reference voltage, and wherein the bias current of the LDO sets a source-drain current of the first MOS transistor.

In Example 8, the subject matter of Example 7 optionally includes LDO circuitry including a voltage supply rail and a second MOS transistor electrically connected to a voltage supply rail, and wherein the first MOS transistor is cascode connected to the second MOS transistor.

In Example 9, the subject matter of one or any combination of Examples 1-8 optionally includes LDO circuitry including a plurality of current mirrors to produce the adjustable bias current, and wherein the logic circuitry includes a state machine circuit configured to enable and disable the current mirrors according to the digital value input to the DTC circuitry.

In Example 10, the subject matter of one or any combination of Examples 1-9 optionally includes LDO circuitry including a plurality of current mirrors to produce the adjustable bias current, and wherein the logic circuitry includes a processor circuit configured to provide the digital value to the DTC circuit and to enable and disable the current mirrors according to the digital value.

Example 11 includes subject matter (such as an apparatus of user equipment (UE)), or can optionally be combined with the subject matter of one or any combination of Examples 1-10 to include such subject matter, comprising physical layer (PHY) circuitry, wherein the PHY circuitry includes radio frequency (RF) transceiver circuitry configured to transmit and receive data from a network or a mobile communication device; a phase modulator operatively coupled to the RF transceiver circuitry, wherein the phase modulator includes digital-to-time converter (DTC) circuitry that converts a digital value to a specified signal phase of a signal transmitted by the RF transmitter circuit; low drop out regulator (LDO) circuitry operatively coupled to the DTC circuitry, wherein a steady-state operation of the LDO circuit is adjustable; and logic circuitry electrically coupled to the LDO circuitry and DTC circuitry, wherein the logic circuitry is configured to adjust the bandwidth of the LDO circuitry according to a digital value input to the DTC circuitry.

In Example 12, the subject matter of Example 11 optionally includes LDO circuitry with steady state operation adjustable using an adjustable bias current, wherein the logic circuitry is configured to set the adjustable bias current to a specified bias current value according to the digital value input to the DTC circuitry.

In Example 13, the subject matter of one or both of Examples 11 and 12 optionally includes a memory circuit configured to store a look up table containing coded current values indexed by the digital value input to the DTC circuitry, wherein the LDO circuitry includes a programmable bias current circuit to produce adjustable bias current, and wherein the logic circuitry is configured to set the bias current of the programmable bias current circuit using a coded current value corresponding to the digital value input to the DTC circuitry.

In Example 14, the subject matter of Example 13 optionally includes a programmable bias current circuit including multiple current source circuits connected in parallel, and wherein the logic circuitry uses the coded current value to one or both of activate and deactivate the current source circuits.

In Example 15, the subject matter of one or any combination of Examples 11-14 optionally includes a local oscillator (LO) circuit configured to provide a LO signal to the DTC circuit, wherein the DTC circuitry converts the digital value to a specified delay of the LO signal.

In Example 16, the subject matter of one or any combination of Examples 11-15 optionally includes digital polar transmitter (DPTX) circuitry that includes the phase modulator and the DTC circuitry.

In Example 17, the subject matter of one or any combination of Examples 11-17 optionally includes one or more antennas electrically coupled to the RF transceiver circuitry.

Example 18 includes subject matter, or can optionally be combined with one or any combination of Examples 1-17 to includes such subject matter, comprising a computer readable storage medium including instructions to control processing circuitry of a mobile radio frequency (RF) communication device to cause the processing circuitry to: determine a phase for a RF signal to be transmitted by a RF transceiver of the mobile RF communication device; provide a digital value input to digital-to-time converter (DTC) circuitry to generate the determined phase for the RF signal; and set an adjustable bias current of low dropout regulator (LDO) circuitry operatively coupled to the DTC circuitry according to the digital value input to the DTC circuitry.

In Example 19, the computer readable storage medium of claim 18 optionally includes instructions to cause the processing circuitry to: read a coded current value from a look up table indexed by the digital value input to the DTC circuitry; and set the adjustable bias current of the LDO circuitry using the coded current value corresponding to the digital value input to the DTC circuitry.

In Example 20, the computer readable storage medium of claim 18 optionally includes instructions to cause the processing circuitry to generate the determined phase by applying a specified time delay to a local oscillator signal according to the digital value input to the DTC circuitry.

Example 21 includes subject matter (such as a method of controlling operation of a mobile radio frequency (RF) communication device), or can optionally be combined with one or any combination of Examples 1-20 to includes such subject matter, comprising determining a phase for a RF signal to be transmitted by a RF transceiver of the mobile RF communication device; providing a digital value input to digital-to-time converter (DTC) circuitry to generate the determined phase for the RF signal; and setting an adjustable bias current of low dropout regulator (LDO) circuitry electrically coupled to the DTC circuitry according to the digital value input to the DTC circuitry.

In Example 22, the subject matter of Example 21 optionally includes reading a coded current value from a look up table indexed by the digital value input to the DTC circuitry; and setting the adjustable bias current of the LDO circuitry using the coded current value corresponding to the digital value input to the DTC circuitry.

In Example 23, the subject matter of one or both of Examples 21 and 22 optionally includes generating the determined phase by applying a specified time delay to a local oscillator signal according to the digital value input to the DTC circuitry.

Example 24 includes subject matter (such as an apparatus), or can optionally be combined with any portion or combination of any portions of any one or more of Examples 1-23 to include such subject matter, comprising: means for determining a phase for a RF signal to be transmitted by a RF transceiver of the mobile RF communication device; means for generating a digital value for input to digital-to-time converter (DTC) circuitry to generate the determined phase for the RF signal by; and means for setting an adjustable bias current of low dropout regulator (LDO) circuitry electrically coupled to the DTC circuitry according to the digital value input to the DTC circuitry.

In Example 25, the subject matter of Example 24 optionally includes means for reading a coded current value from a look up table indexed by the digital value input to the DTC circuitry, wherein the means for setting the adjustable bias current includes means for setting the adjustable bias current of the LDO circuitry using the coded current value corresponding to the digital value input to the DTC circuitry.

In Example 26, the subject matter of one or both of Examples 24 and 25 optionally includes DTC circuitry configured to generate the determined phase by applying a specified time delay to a local oscillator signal according to the digital value input to the DTC circuitry.

Example 27 includes subject matter (such as an apparatus), or can optionally be combined with one or any combination of Examples 1-26 to include such subject matter comprising: a local oscillator (LO) circuit that provides a LO signal; digital-to-time converter (DTC) circuitry operatively coupled to the LO circuit and configured to convert a received digital value to a specified value of signal phase of the LO signal; and low drop out regulator (LDO) circuitry operatively coupled to the DTC circuitry, wherein the LDO circuitry includes a plurality of current mirrors to produce an adjustable bias current of the LDO circuitry and a value of the bias current of the LDO is determined according to the digital value received by the DTC circuitry.

In Example 28, the subject matter of Example 27 optionally includes LDO circuitry that includes an error amplifier circuit and a pass gate circuit that includes a first metal oxide semiconductor (MOS) transistor, wherein the error amplifier circuit is configured to activate the pass gate circuit according to a difference between a voltage at the LDO output and a reference voltage, and wherein the bias current of the LDO sets a source-drain current of the first MOS transistor.

In Example 29, the subject matter of one or both of Examples 27 and 28 optionally includes LDO circuitry that includes a voltage supply rail and a second MOS transistor electrically connected to a voltage supply rail, and wherein the first MOS transistor is cascode connected to the second MOS transistor.

In Example 30, the subject matter of one or any combination of Examples 27-29 optionally includes a state machine circuit configured to enable and disable the current mirrors according to the digital value input to the DTC circuitry.

These non-limiting examples can be combined in any permutation or combination.

The above detailed description includes references to the accompanying drawings, which form a part of the detailed description. The drawings show, by way of illustration, specific embodiments that can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

Method examples described herein can be machine or computer-implemented at least in part. Some examples can include a computer-readable storage medium or machine-readable storage medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. The code can be tangibly stored on one or more volatile, non-transitory, or non-volatile tangible computer-readable media, such as during execution or at other times. Examples of these tangible computer-readable storage media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment. Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

What is claimed is:

1. An apparatus comprising:
   radio frequency (RF) transceiver circuitry configured to transmit and receive data with a network and a mobile communication device;
   a phase modulator comprising digital-to-time converter (DTC) circuitry configured to convert a digital value to a specified value of signal phase of the data transmitted by the RF transceiver circuit;
   low drop out regulator (LDO) circuitry operatively coupled to the DTC circuitry, wherein a bias current of the LDO circuitry is adjustable; and
   logic circuitry operatively coupled to the LDO circuitry and DTC circuitry, wherein the log circuitry is configured to set the bias current of the LDO circuitry according to a digital value input to the DTC circuitry.

2. The apparatus of claim 1, including memory circuitry configured to store a look up table containing coded current values indexed by the digital value input to the DTC circuitry, wherein the LDO circuitry includes a programmable bias current circuit to produce the bias current, and wherein the logic circuitry is configured to set the bias current of the programmable bias current circuit using a coded current value corresponding to the digital value input to the DTC circuitry.

3. The apparatus of claim 2, wherein the programmable bias current circuit includes multiple current source circuits connected in parallel, and wherein the logic circuitry is configured to perform one or both of activating and deactivating the current source circuits according to the coded current value.

4. The apparatus of claim 1, including a local oscillator (LO) circuit that provides a LO signal to the DTC circuitry, wherein the DTC circuitry converts the digital value to a specified delay of the LO signal.

5. The apparatus of claim 4, wherein the DTC circuitry includes a delay line electrically coupled to the LO circuit, wherein the delay line includes multiple unit circuit delays electrically coupled in series, and wherein the DTC circuitry is configured to apply the LO signal to a specified number of the unit circuit delays according to the digital value.

6. The apparatus of claim 1, wherein the phase modulator and the DTC circuitry are included in digital polar transmitter (DPTX) circuitry configured to apply amplitude and phase modulation to the signal transmitted by the RF transceiver circuitry.

7. The apparatus of claim 1, wherein the LDO circuitry includes an error amplifier circuit and a pass gate circuit that includes a first metal oxide semiconductor (MOS) transistor, wherein the error amplifier circuit is configured to activate the pass gate circuit according to a difference between a voltage at the LDO output and a reference voltage, and wherein the bias current of the LDO sets a source-drain current of the first MOS transistor.

8. The apparatus of claim 7, wherein the LDO circuitry includes a voltage supply rail and a second MOS transistor electrically connected to a voltage supply rail, and wherein the first MOS transistor is cascode connected to the second MOS transistor.

9. The apparatus of claim 1, wherein the LDO circuitry includes a plurality of current mirrors to produce the adjustable bias current, and wherein the logic circuitry includes a state machine circuit configured to enable and disable the current mirrors according to the digital value input to the DTC circuitry.

10. The apparatus of claim 1, wherein the LDO circuitry includes a plurality of current mirrors to produce the adjustable bias current, and wherein the logic circuitry includes a processor circuit configured to provide the digital value to the DTC circuit and to enable and disable the current mirrors according to the digital value.

11. An apparatus of user equipment (UE), the apparatus comprising:
    physical layer (PHY) circuitry, wherein the PHY circuitry comprises radio frequency (RF) transceiver circuitry configured to transmit and receive data from a network or a mobile communication device;
    a phase modulator operatively coupled to the RF transceiver circuitry, wherein the phase modulator comprises digital-to-time converter (DTC) circuitry configured to convert a digital value to a specified signal phase of a signal transmitted by the RF transmitter circuitry;
    low drop out regulator (LDO) circuitry operatively coupled to the DTC circuitry, wherein a steady-state operation of the LDO circuitry is adjustable; and
    logic circuitry operatively coupled to the LDO circuitry and DTC circuitry, wherein the logic circuitry is configured to adjust the bandwidth of the LDO circuitry according to a digital value input to the DTC circuitry.

12. The apparatus of claim 11, wherein the steady-state operation of the LDO circuitry is adjustable using an adjustable bias current, wherein the logic circuitry is configured to set the adjustable bias current to a specified bias current value according to the digital value input to the DTC circuitry.

13. The apparatus of claim 12, including memory circuitry configured to store a look up table containing coded current values indexed by the digital value input to the DTC circuit, wherein the LDO circuitry includes a programmable bias current circuit to produce the adjustable bias current, and wherein the logic circuitry is configured to set the bias current of the programmable bias current circuit using a coded current value corresponding to the digital value input to the DTC circuitry.

14. The apparatus of claim 13, wherein the programmable bias current circuit includes multiple current source circuits connected in parallel, and wherein the logic circuitry uses the coded current value to one or both of activate and deactivate the current source circuits.

15. The apparatus of claim 11, including a local oscillator (LO) circuit that provides a LO signal to the DTC circuitry, wherein the DTC circuitry converts the digital value to a specified delay of the LO signal.

16. The apparatus of claim 11, including digital polar transmitter (DPTX) circuitry that includes the phase modulator and the DTC circuitry.

17. The apparatus of claim 11, including one or more antennas electrically coupled to the RF transceiver circuitry.

18. A non-transitory computer readable storage medium comprising instructions configured to control processing circuitry of a mobile radio frequency (RF) communication device to cause the processing circuitry to:
    determine a phase for a RF signal to be transmitted by a RF transceiver of the mobile RF communication device;
    provide a digital value input to a digital-to-time converter (DTC) circuitry to generate the determined phase for the RF signal; and set an adjustable bias current of a low dropout regulator (LDO) circuitry operatively coupled to the DTC circuit according to the digital value input to the DTC circuitry.

19. The non-transitory computer readable storage medium of claim 18, including instructions that cause the processing circuitry to:

read a coded current value from a look up table indexed by the digital value input to the circuitry; and set the adjustable bias current of the LDO circuitry using the coded current value corresponding to the digital value input to the DTC circuitry.

20. The non-transitory computer readable storage medium of claim 18, including instructions that cause the processing circuitry to generate the determined phase by applying a specified time delay to a local oscillator signal according to the digital value input to the DTC circuitry.

21. An apparatus comprising;

a local oscillator (LO) circuit that provides a LO signal;

digital-to-time converter (DTC) circuitry operatively coupled to the LO circuit and configured to convert a received digital value to a specified value of signal phase of the LO signal; and low drop out regulator (LDO) circuitry operatively coupled to the DTC circuitry, wherein the LDO circuitry includes a plurality of current mirrors to produce an adjustable bias current of the LDO circuitry and a value of the bias current of the LDO is determined according to the digital value received by the DTC circuitry.

22. The apparatus of claim 21, wherein the LDO circuitry includes an error amplifier circuit and a pass gate circuit that includes a first metal oxide semiconductor (MOS) transistor, wherein the error amplifier circuit is configured to activate the pass gate circuit according to a difference between a voltage at the LDO output and a reference voltage, and wherein the bias current of the LDO sets a source-drain current of the first MOS transistor.

23. The apparatus of claim 21, wherein the LDO circuitry includes a voltage supply rail and a second MOS transistor electrically connected to a voltage supply rail, and wherein the first MOS transistor is cascode connected to the second MOS transistor.

24. The apparatus of claim 21, including state machine circuit configured to enable and disable the current mirrors according to the digital value input to the DTC circuitry.

* * * * *

UNITED STATES PATENT AND TRADEMARK OFFICE
CERTIFICATE OF CORRECTION

PATENT NO. : 9,806,759 B1  
APPLICATION NO. : 15/200495  
DATED : October 31, 2017  
INVENTOR(S) : Sievert et al.

Page 1 of 1

It is certified that error appears in the above-identified patent and that said Letters Patent is hereby corrected as shown below:

In the Claims

In Column 13, Line 16, in Claim 1, delete "log" and insert --logic-- therefor

In Column 15, Line 9, in Claim 19, before "circuitry;", insert --DTC--

In Column 16, Line 21, in Claim 24, after "including", insert --a--

Signed and Sealed this  
Twenty-eighth Day of May, 2019

Andrei Iancu  
*Director of the United States Patent and Trademark Office*